(12) United States Patent
Wang

(10) Patent No.: US 11,912,912 B2
(45) Date of Patent: Feb. 27, 2024

(54) QUANTUM DOT MATERIAL AND METHOD FOR MANUFACTURING THE SAME, LIGHT EMITTING DIODE, AND DISPLAY PANEL

(71) Applicant: BOE TECHNOLOGY GROUP CO., LTD., Beijing (CN)

(72) Inventor: Tieshi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 17/354,162

(22) Filed: Jun. 22, 2021

(65) Prior Publication Data

US 2022/0162500 A1    May 26, 2022

(30) Foreign Application Priority Data

Nov. 26, 2020   (CN) .......................... 202011351550.X

(51) Int. Cl.
| | | |
|---|---|---|
| C09K 11/02 | (2006.01) | |
| C09K 11/54 | (2006.01) | |
| H10K 50/115 | (2023.01) | |
| H10K 50/16 | (2023.01) | |
| B82Y 20/00 | (2011.01) | |

(Continued)

(52) U.S. Cl.
CPC ............ *C09K 11/02* (2013.01); *C09K 11/025* (2013.01); *C09K 11/54* (2013.01); *H10K 50/115* (2023.02); *H10K 50/167* (2023.02); *B82Y 20/00* (2013.01); *H10K 50/15* (2023.02); *H10K 50/16* (2023.02); *H10K 50/17* (2023.02); *H10K 85/6572* (2023.02)

(58) Field of Classification Search
CPC ....... C09K 11/025; C09K 11/02; H01L 5/502; H10K 50/115
See application file for complete search history.

(56) References Cited

U.S. PATENT DOCUMENTS

| | | | |
|---|---|---|---|
| 2012/0032115 A1* | 2/2012 | Harada ............... | H01L 51/0072 252/301.16 |
| 2013/0026426 A1* | 1/2013 | Harada .................. | C07F 5/027 977/932 |

(Continued)

FOREIGN PATENT DOCUMENTS

| | | |
|---|---|---|
| CN | 106848079 A | 6/2017 |
| CN | 107163034 A | 9/2017 |

(Continued)

OTHER PUBLICATIONS

China Patent Office, CN202011351550.X First Office Action dated Jul. 18, 2023.

*Primary Examiner* — C Melissa Koslow

(74) *Attorney, Agent, or Firm* — HOUTTEMAN LAW LLC

(57) ABSTRACT

The present disclosure provides a quantum dot material comprising a quantum dot body and a hole transport ligand bonded to the quantum dot body through a coordinate bond. The hole transport ligand comprises a carbazolyl group, at least one coordinating group and at least one crosslinking group having an unsaturated bond. Both of the coordinating group and the crosslinking group are terminal groups of the hole transport ligand, and the coordinating group provides the coordinate bond. The present disclosure also provides a method for manufacturing the quantum dot material, a light emitting diode and a display panel.

11 Claims, 5 Drawing Sheets

(51) Int. Cl.
  *H10K 50/15* (2023.01)
  *H10K 50/17* (2023.01)
  *H10K 85/60* (2023.01)

(56) References Cited

U.S. PATENT DOCUMENTS

| | | |
|---|---|---|
| 2013/0214249 A1 | 8/2013 | Pan et al. |
| 2019/0319208 A1 | 10/2019 | Han et al. |
| 2020/0075877 A1* | 3/2020 | Yu .................. H01L 51/5092 |
| 2021/0091324 A1* | 3/2021 | Jung ................. H01L 51/502 |

FOREIGN PATENT DOCUMENTS

| | | |
|---|---|---|
| CN | 107946485 A | 4/2018 |
| CN | 108550707 A | 9/2018 |
| CN | 108963098 A | 12/2018 |
| CN | 109980129 A | 7/2019 |
| CN | 110277501 A | 9/2019 |
| CN | 111117357 A | 5/2020 |
| CN | 111686814 A | 9/2020 |
| JP | 2020/066733 * | 4/2020 |

\* cited by examiner

| Second Electrode |
| --- |
| Electron Transport Layer |
| Quantum Dot Light Emitting Layer |
| Hole Transport Layer |
| Hole Injection Laye |
| First Electrode |

QUANTUM DOT MATERIAL AND METHOD FOR MANUFACTURING THE SAME, LIGHT EMITTING DIODE, AND DISPLAY PANEL

TECHNICAL FIELD

The present disclosure relates to the field of display technologies, and particularly relates to a quantum dot material and a method for manufacturing the same, a light emitting diode, and a display panel.

BACKGROUND ART

Quantum dot light emitting diodes (QLED) have a light emitting layer comprising quantum dot light emitting materials, wherein the quantum dots in the quantum dot light emitting material can emit light of a predetermined color when being excited by an electric field. Because the QLED can emit light with high color purity and high stability, the QLED is applied to display devices and gradually becomes an emerging display technology.

At present, a traditional QLED device comprises a hole injection layer (HIL), a hole transport layer (HTL), a quantum dot (QD) layer, an electron transport layer (ETL) and the like. Since metal oxide semiconductor nanoparticles with high electron mobility such as ZnO, ZnMgO, etc. are generally used as ETL materials, and organic materials with relatively low hole mobility are generally used as HIL and HTL materials, which leads to an unbalance of carrier injection of the device, and thus a recombination region easily appeared in HTL. It is pursued in the art to improve the carrier injection balance of the device and restrict the exciton recombination region in the quantum dot layer, thereby further improving the light emitting efficiency of the quantum dot light emitting diode.

SUMMARY

The present disclosure is directed to a quantum dot material and a method for manufacturing the same, a light emitting diode, and a display panel.

As the first aspect of the present disclosure, a quantum dot material comprising quantum dots is provided, wherein the quantum dot comprises a quantum dot body and a hole transport ligand bonded to the quantum dot body through a coordinate bond; the hole transport ligand comprises a carbazolyl group, at least one coordinating group and at least one crosslinking group having an unsaturated bond; both of the coordinating group and the crosslinking group are terminal groups of the hole transport ligand, and the coordinating group provides the coordinate bond.

Optionally, in the hole transport ligand, a total number of the coordinating group and the crosslinking group is not less than 3.

Optionally, the hole transport ligand has a structural formula as follows:

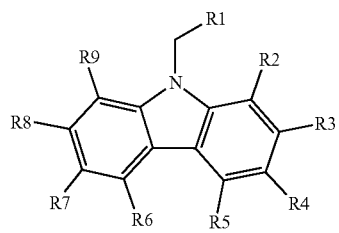

wherein at least three of R1 to R9 each have the coordinating group or the crosslinking group as a terminal group.

Optionally, none of R1 to R9 is hydrogen, and adjacent two of R1 to R9 each have a different terminal group.

Optionally, R1, R4 and R7 each have a terminal group independently selected from any one of the coordinating group and the crosslinking group.

Optionally, the hole transport ligand further satisfies any one of the following conditions:

R1 has the coordinating group as a terminal group, and R2 and R9 each have the crosslinking group as a terminal group;

R3, R5, R6 and R8 each have the coordinating group as a terminal group, and R4 and R7 each have the crosslinking group as a terminal group; and R1, R3, R5, R6 and R8 each have the crosslinking group as a terminal group, and R2, R4, R7 and R9 each have the coordinating group as a terminal group.

Optionally, in R1 to R9, the coordinating group is linked to the carbazolyl group through a first alkyl chain, and the first alkyl chain has a number of carbon atoms of not more than 10.

Optionally, in R1 to R9, the crosslinking group is linked to the carbazolyl group through a second alkyl chain, and the second alkyl chain has a number of carbon atoms of not more than 10.

Optionally, at least one of R1 to R9 has a benzene ring.

Optionally, the coordinating group of the hole transport ligand is at least one selected from mercapto, poly-mercapto, carboxyl, amino, polyamino, and phosphinyloxy group.

Optionally, the hole transport ligand has a structural formula selected from any one of:

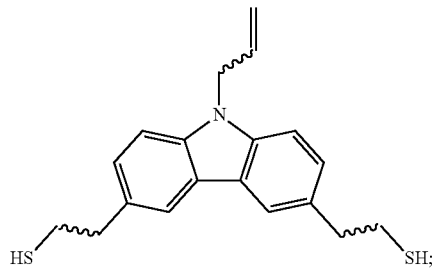

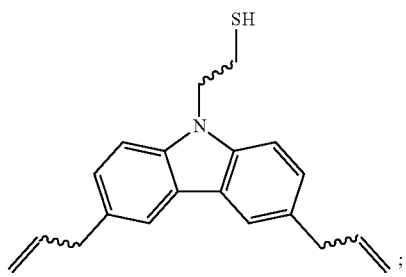

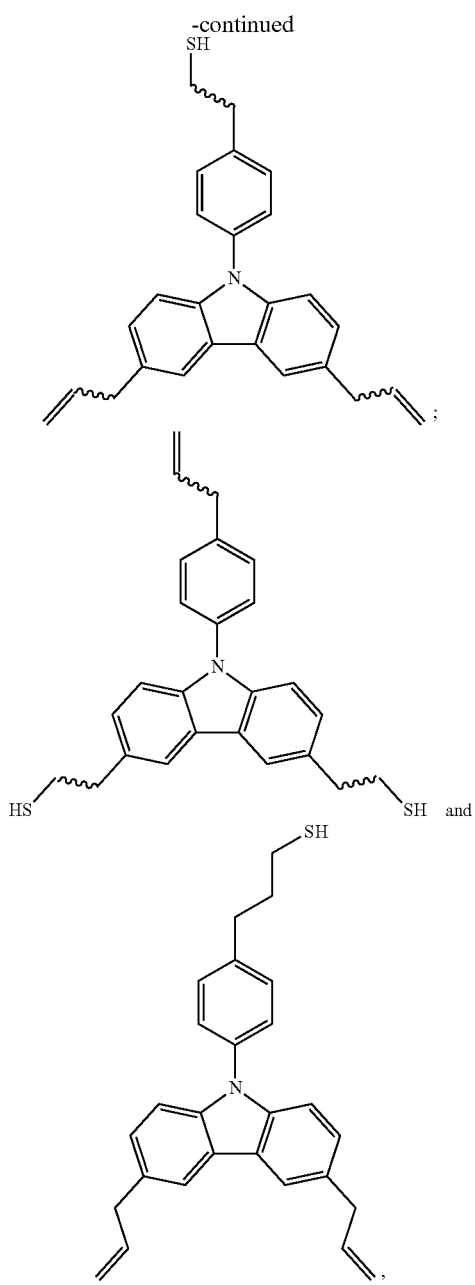

wherein ⁓ is an alkyl chain having a number of carbon atoms of not more than 10.

As the second aspect of the present disclosure, a method for manufacturing a quantum dot material is provided. The method comprising steps of:

providing a solution of ligand compound, wherein the ligand compound comprises a carbazolyl group, at least one coordinating group and at least one crosslinking group, and both of the coordinating group and the crosslinking group are terminal groups of the ligand compound;

providing a solution of an initial quantum dot, wherein the initial quantum dot comprises a quantum dot body; and mixing the solution of the ligand compound with the solution of the initial quantum dot, so as to make the ligand compound react with the quantum dot body, wherein the coordinating group of the ligand compound is bonded to the quantum dot body to obtain the quantum dot material.

Optionally, the step of providing a solution of ligand compound comprises:

reacting 3,6-dibromocarbazole with a boric acid compound having a structural formula of

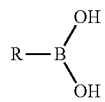

to obtain an intermediate of

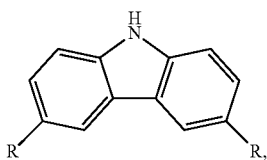

wherein R is a coordinating group or a crosslinking group and replaces the bromine in 3,6-dibromocarbazole; and reacting the intermediate with a bromo-compound having a a structural formula of R1-Br to obtain the ligand compound, wherein R1 comprises the coordinating group or the crosslinking group as a terminal group, and replaces the hydrogen in the imine group of the intermediate.

As the third aspect of the present disclosure, a light emitting diode comprising a quantum dot light emitting layer is provided, wherein the quantum dot light emitting layer has a net structure formed by the hole transport ligands of the quantum dot material connecting one another according to the present disclosure.

Optionally, in the quantum dot light emitting layer, a plurality of the quantum dots are crosslinked with each other through the crosslinking groups; and/or in the quantum dot light emitting layer, at least one quantum dot has the hole transport ligand comprising a plurality of coordinating groups, wherein one of the coordinating groups is bonded to the quantum dot body of the quantum dot, and the other coordinating groups are bonded to quantum dot bodies of other quantum dots.

Optionally, the light emitting diode further comprises a first electrode, an electron transport layer, and a second electrode, which are sequentially stacked.

As the fourth aspect of the present disclosure, a display panel comprising a light emitting diode according to the present disclosure is provided.

The present disclosure provides a quantum dot modified by a hole transport ligand with better hole transport performance, thereby omitting the hole transport layer in traditional QLED devices, simplifying the structure of the device, improving the carrier injection balance of the device, and restricting the exciton recombination region in the quantum dot layer. Meanwhile, the crosslinking performance of the hole transport ligand improves the compactness of the quantum dot layer and endows the quantum dot layer with solvent corrosion resistance, thereby preventing the corrosion and the damage of the subsequent processes, and improving the performance of the QLED device.

BRIEF DESCRIPTION OF THE DRAWINGS

The accompanying drawings, that constituted a part of the description, are included to provide a further understanding of the present disclosure and illustrate the present disclosure together with the following embodiments, but do not constitute a limitation to the present disclosure. In the drawings.

DETAILED DESCRIPTIONS

The specific embodiments of the present disclosure will be described in detail below with reference to the accompanying drawings. It should be understood that the specific embodiments described herein are given by way of illustration and explanation only, not limitation of the present disclosure.

Figures 1, 2:
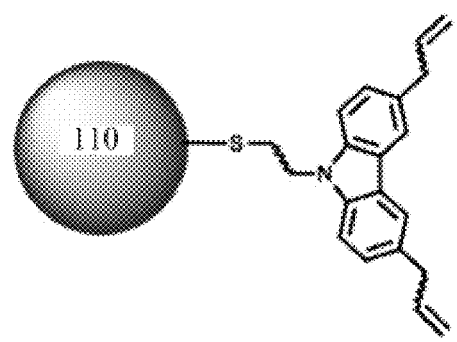
FIG. 1 is a schematic diagram of a quantum dot light emitting diode in the prior art.
FIG. 2 is a schematic structure diagram of the quantum dot of the quantum dot material according to one embodiment of the present disclosure.

FIG. 1 is a schematic diagram of a quantum dot light emitting diode of the prior art. As shown in FIG. 1, such a quantum dot light emitting diode comprises a first electrode, a hole injection layer, a hole transport layer, a quantum dot light emitting layer, an electron transport layer and a second electrode, which are sequentially stacked.

In the quantum dot light emitting diode of the prior art, the electron transport layer is mostly made of metal oxide semiconductor nanoparticles having high electron mobility (such as ZnO, ZnMgO, etc.), and the hole injection layer and the hole transport layer are mostly made of organic materials. Compared with the metal oxide semiconductor nanoparticles, the carrier mobility of organic materials is relatively low, which causes an unbalance of the carrier injection and the exciton recombination region in the hole transport layer not the quantum dot light emitting layer when the quantum dot light emitting diode emits light, thereby reducing the light emitting efficiency of the quantum dot light emitting diode.

In view of the above, in an alternative embodiment of the present disclosure, a quantum dot material comprising quantum dots is provided. As shown in FIG. 2, the quantum dot comprises a quantum dot body 110 and a hole transport ligand bonded to the quantum dot body through a coordinate bond. The hole transport ligand comprises a carbazolyl group, at least one coordinating group and at least one crosslinking group having an unsaturated bond, wherein both of the coordinating group and the crosslinking group being terminal groups of the hole transport ligand, and the coordinating group is used to provide the coordinate bond.

In the quantum dot material according to the present disclosure, the quantum dot body 110 can perform a basic function of the quantum dot, that is, the quantum dot body 110 can emit light of a predetermined color when being excited by a predetermined electric field. In addition, in the hole transport ligand, the terminal group is linked to the carbazolyl group through a linking group such as an alkyl chain. The crosslinking group has an unsaturated bond and is configured such that a plurality of crosslinking groups can undergo crosslinking reactions with one another under specific conditions and thus can be linked together.

The carbazolyl group has a good hole transport performance. When the quantum dot material is applied to a quantum dot light emitting layer of a quantum dot light emitting diode, the carbazolyl group in the hole transport ligand of the quantum dot can play a role of transporting hole to the quantum dot light emitting layer, thereby providing a more balanced injection of carriers and improving the light emitting efficiency.

In the present disclosure, the coordinating group may further modify surface defects of the quantum dot body 110, improve the stability of the quantum dot body 110 during the preparation of the quantum dot light emitting layer, and ensure that the quantum dot body 110 can be excited to emit light.

The crosslinking groups comprise unsaturated bonds. During the curing of the quantum dot material, the crosslinking groups of different quantum dots may crosslink, such that the quantum dot material is cured to obtain a compact and stable net structure. When the quantum dot material is applied to a quantum dot light emitting diode, the quantum dot light emitting layer obtained after curing of the quantum dot material has a compact net structure. When manufacturing the quantum dot light emitting diode, a solution process is usually adopted. The quantum dot light emitting layer with a compact net structure has strong corrosion resistance and may remain stable in the subsequent solution processes, and therefore improving the excellent rate of the quantum dot light emitting diode.

In addition, the quantum dot material may be cured by crosslinking the crosslinking groups of the quantum dots in the quantum dot material, and no additional material for curing is required, thereby reducing the requirement of materials for manufacturing the quantum dot light emitting diode, simplifying the manufacturing process and reducing the manufacturing cost.

In the present disclosure, the coordinating group is not particularly limited. For example, the coordinating group may be selected from at least one of mercapto, polymercapto, carboxyl, amino, polyamino, and phosphinyloxy group. In some case, a plurality of these coordinating groups may be included in the same hole transport ligand.

In the present disclosure, the specific form of the crosslinking group is not particularly limited as long as the crosslinking group comprises an unsaturated bond. For example, the crosslinking group may be vinyl, or may be any one of propenyl, ethynyl and propynyl.

It should be noted that when the quantum dot material is cured to form the quantum dot light emitting layer, the crosslinking occurs not only through the crosslinking group in the hole transport ligand, but also through other groups (for example, coordinating groups on the hole transport ligands of different quantum dots may also be crosslinked with one another), so as to further increase the compactness of the net structure of the quantum dot light emitting layer.

In the present disclosure, the number of coordinating groups and crosslinking groups in the hole transport ligand is not particularly limited. In an alternative embodiment, the total number of coordinating groups and crosslinking groups is not less than three. That is to say, in the hole transport ligand, the number of at least one of the coordinating group and the crosslinking group is two or more.

The total number of the coordinating groups and the crosslinking groups is not less than three, so as to improve the compactness of the net structure obtained after the curing of the quantum dot material.

In an alternative embodiment, the hole transport ligand has a plurality of crosslinking groups. Regarding a certain quantum dot, all crosslinking groups in the hole transport ligand linked to the quantum dot body may be crosslinked with crosslinking groups of hole transport ligands of other quantum dots, thereby forming a more compact net structure.

Figure 3:
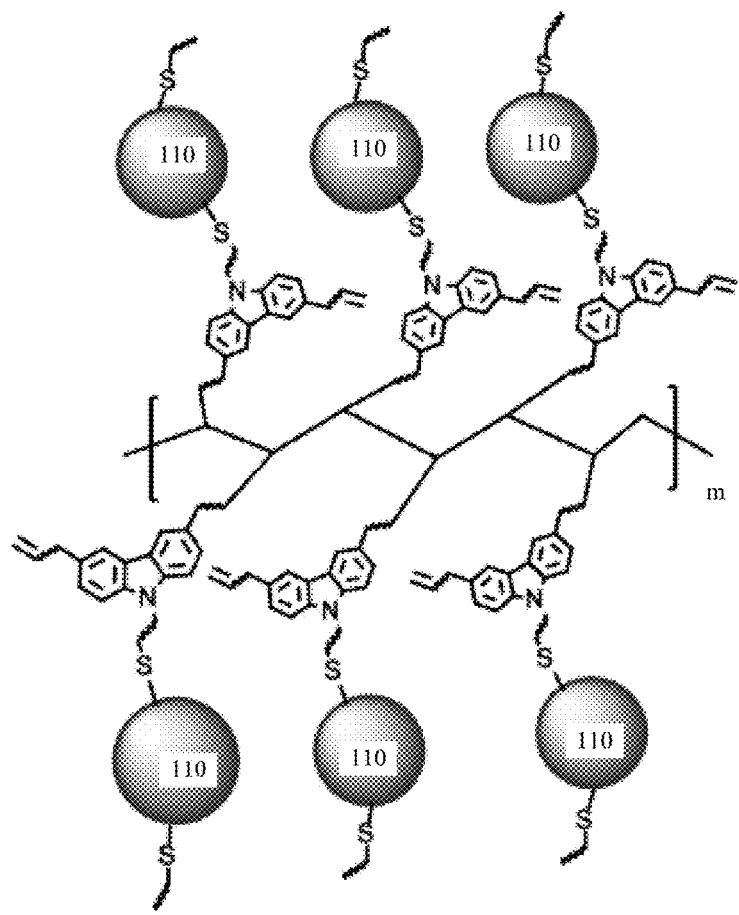
FIG. 3 is a schematic diagram of the net structure obtained after curing of the quantum dot material according to one embodiment of the present disclosure.

FIG. 3 shows a schematic diagram of the net structure obtained after curing of the quantum dot material according to one embodiment of the present disclosure. As shown in FIG. 3, the hole transport ligand has a plurality of crosslinking groups (in this embodiment, the crosslinking groups are vinyl), and the hole transport ligands of different quantum dots are crosslinked with each other. In FIG. 3, it is also shown that the mercapto groups serving as coordinating groups in hole transport ligands of different quantum dots are crosslinked.

Figure 4:
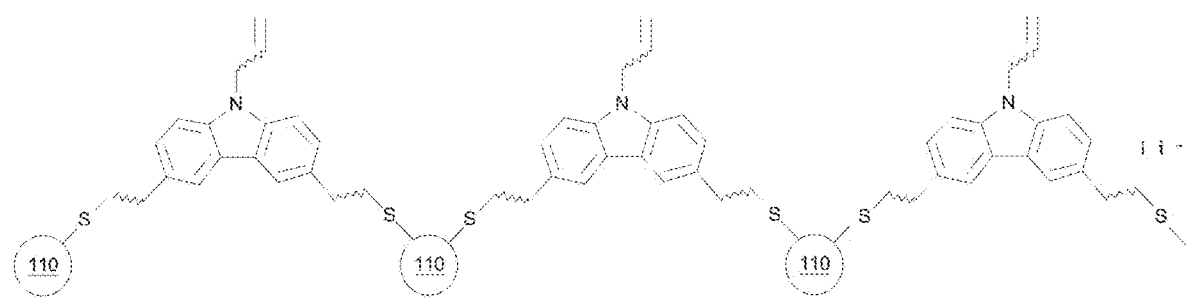
FIG. 4 is a schematic diagram of the net structure obtained after curing of the quantum dot material according to another embodiment of the present disclosure.

In an alternative embodiment, as shown in FIG. 4, the hole transport ligand has a plurality of coordinating groups, and each of the coordinating groups may be bonded to the quantum dot body 110, thereby forming a net structure. In other words, for a quantum dot comprising a plurality of coordinating groups, one of the coordinating groups of the hole transport ligand is bonded to the quantum dot body of the same quantum dot, and the other coordinating groups may be bonded to quantum dot bodies of other quantum dots, thereby forming a net structure.

In an alternative embodiment, the hole transport ligand has a structural formula of:

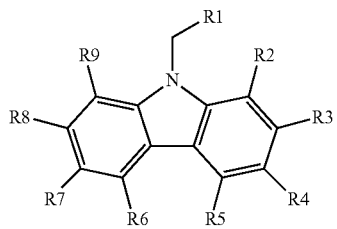

wherein at least three of R1 to R9 each have the coordinating group or the crosslinking group as a terminal group.

In the present disclosure, the position of the coordinating group and the crosslinking group on the carbazolyl group is not particularly limited. In an alternative embodiment, R1, R4 and R7 each have a terminal group independently selected from any one of the coordinating group and the crosslinking group. That is, in such an embodiment, the coordinating group and the crosslinking group, and alternatively the coordinating group and the coordinating group, and alternatively the crosslinking group and the crosslinking group are spaced from each other, so as to increase the steric hindrance. Steric hindrance effect is also called steric effect, and mainly refers to steric hindrance caused by certain atoms or groups in a molecule approaching each other. Increasing the steric hindrance of the hole transport ligand may prevent a plurality of coordinating groups from being coordinated with the same quantum dot body, and prevent two terminal groups of the same kind (for example two coordinating groups or two crosslinking groups) on one hole transport ligand from being bonded to the same quantum dot body.

The coordinating group may provide a coordinate bond after losing hydrogen. When the hole transport ligand is bonded to the quantum dot body, the quantum dot described above is formed.

In the present disclosure, "comprising a coordinating group" is not particularly limited. The group comprising a coordinating group may be the coordinating group itself. Alternatively, the group comprising a coordinating group may have other groups or functional groups in addition to the coordinating group. It is to be noted, however, that in the present disclosure, the coordinating group plays a role of providing a coordinate bond, and therefore, the coordinating group should be located at the terminal of the hole transport ligand.

In one embodiment of the present disclosure, none of R1 to R9 is hydrogen and the adjacent two of R1 to R9 each have a terminal group different from each other.

For example, the hole transport ligand further satisfies any one of the following conditions:

R1 has a terminal group of the coordinating group, and R2 and R9 each have a terminal group of the crosslinking group;

R3, R5, R6 and R8 each have a terminal group of the coordinating group, and R4 and R7 each have a terminal group of the crosslinking group; and R1, R3, R5, R6 and R8 each have a terminal group of the crosslinking group, and R2, R4, R7 and R9 each have a terminal group of the coordinating group.

In an alternative embodiment, in R1 to R9, the coordinating group is linked to the carbazolyl group through a first alkyl chain, and the first alkyl chain has a number of carbon atoms of not more than 10. The number of carbon atoms of the first alkyl chain is not more than 10, so as to improve the flexibility of the net structure obtained after the curing of the quantum dot material. As described above, there may be a plurality of coordinating groups in the same hole transport ligand, and the first alkyl chain is disposed to prevent the plurality of coordinating groups in the same hole transport ligand from coordinating to the same quantum dot body.

As described above, the hole transport ligand may comprise the crosslinking group. Accordingly, in the above structural formulae, in R1 to R9, the crosslinking group is linked to the carbazolyl group through a second alkyl chain, and the second alkyl chain has a number of carbon atoms of not more than 10. Similarly, limiting the number of carbon atoms in the second alkyl chain is also beneficial to the good flexibility of the net structure obtained after the curing of the quantum dot material.

Similarly, to the explanation of "comprising a coordinating group", the group "comprising a crosslinking group" may be a crosslinking group per se, or may be a combination of other structures and a crosslinking group.

In an alternative embodiment, at least one of R1 to R9 has a benzene ring group. The benzene ring group has conjugation property and can adjust the hole transport performance of the ligand group.

In the present disclosure, the specific form of "comprising a benzene ring group" is also not particularly limited.

In an alternative embodiment, R1 to R9 may also comprise —H.

In an alternative embodiment, the crosslinking group (in this embodiment, the crosslinking group is vinyl) linked by the second alkyl chain has a structural formula of:

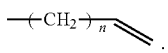

In an alternative embodiment, the coordinating group (in this embodiment, the coordinating group is mercapto) linked by the first alkyl chain has a structural formula of:

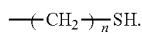

In an alternative embodiment, the group comprising the benzene ring, the first alkyl chain, and the coordinating group (in this embodiment, the coordinating group is mercapto) has a structural formula of:

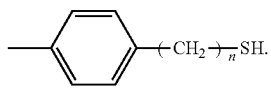

In an alternative embodiment, the group comprising the benzene ring, the second alkyl chain, and the crosslinking group (in this embodiment, the crosslinking group is vinyl) has a structural formula of:

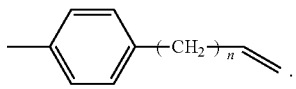

In the above structural formulae, 1 n 10.

When the quantum dot material is applied in a quantum dot light emitting diode, the quantum dot light emitting layer obtained by curing the quantum dot material has good flexibility, and therefore the quantum dot light emitting diode also has good flexibility.

In alternative embodiments of the present disclosure, the hole transport ligand has a structure selected from any one of:

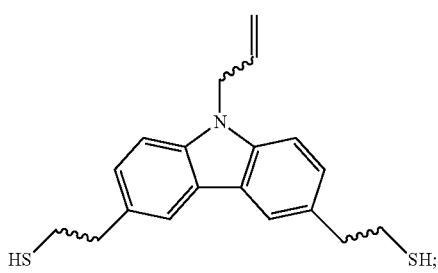

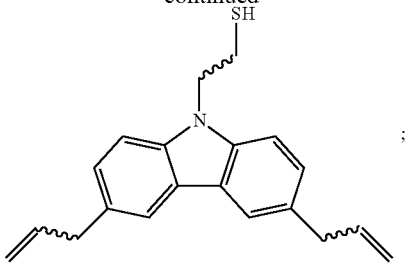

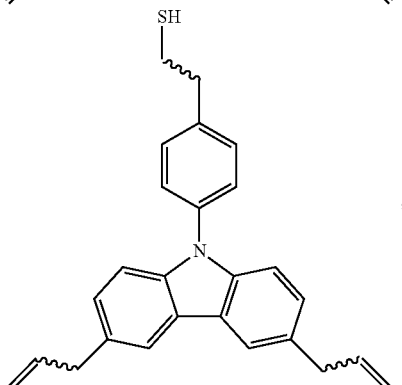

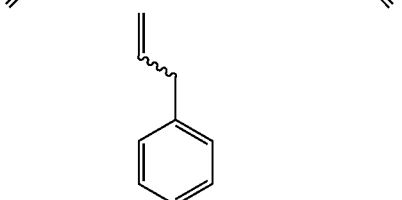

and

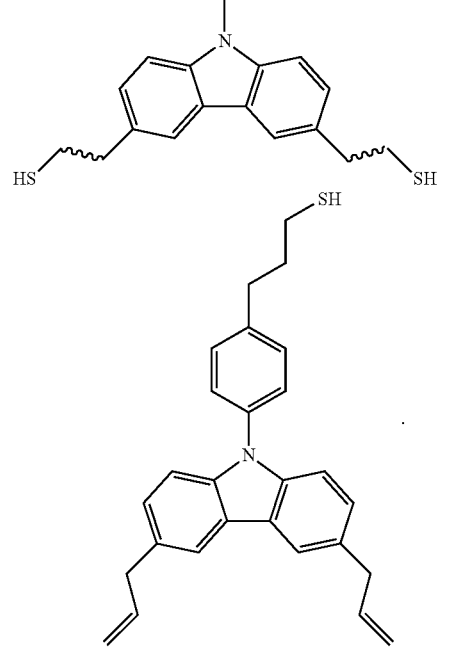

wherein ～ is an alkyl chain having a number of carbon atoms of not more than 10.

In the present disclosure, specific structures and specific materials of the quantum dot bodies are not particularly limited, as long as it can emit light of a predetermined wavelength under excitation of the electric field. The quantum body has a core-shell structure, and the hole transport ligand is bonded on the quantum dot body through a coordinate bond as the shell of the core-shell structure. In an alternative embodiment, the quantum dot body may be a CdSe/CdZnSeS/ZnS quantum dot.

Figure 5:
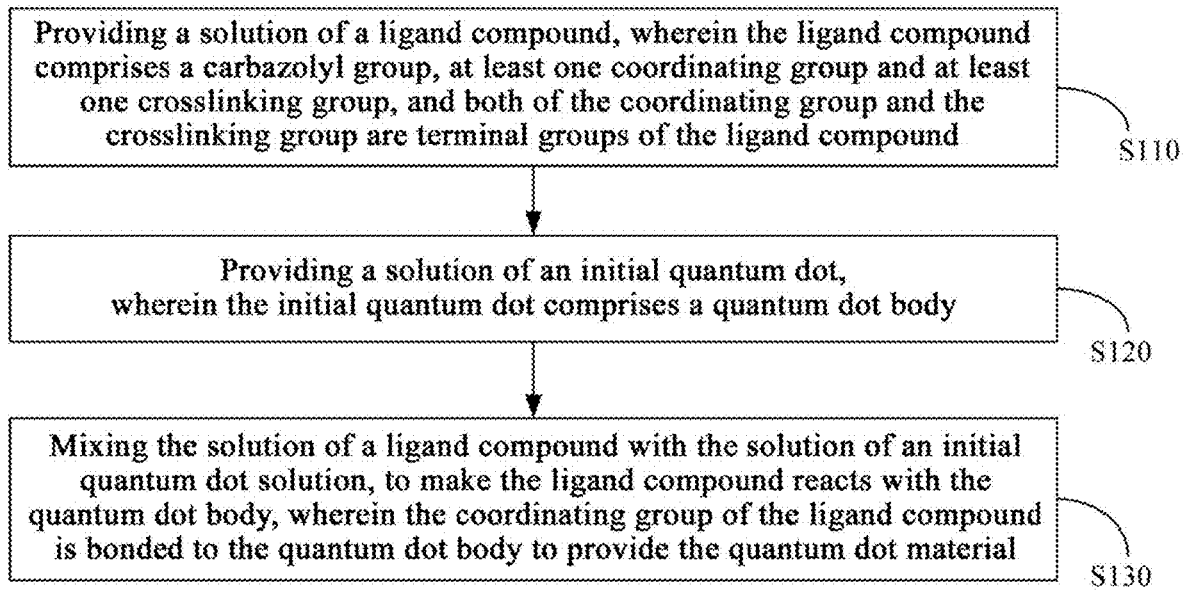
FIG. 5 is flow chart of the method for manufacturing the quantum dot material according to the present disclosure.

In an alternative embodiment of the present disclosure, a method for manufacturing a quantum dot material is provided. As shown in FIG. 5, the method comprises:

step S110, providing solution of a ligand compound, wherein the ligand compound comprises a carbazolyl group, at least one coordinating group and at least one crosslinking group, and both of the coordinating group and the crosslinking group are terminal groups of the ligand compound;

step S120, providing a solution of an initial quantum dot, wherein the initial quantum dot comprises a quantum dot body; and step S130, mixing the solution of a ligand compound with the solution of a initial quantum dot, such that the ligand compound reacts with the quantum dot body, wherein the coordinating group of the ligand compound is bonded to the quantum dot body to provide the quantum dot material.

The quantum dot material according to the present disclosure may be prepared by the method, and the principle and advantages of the quantum dot material have been described in detail above, and are not described herein again.

It should be noted that, the step S130 should be maintained under a reaction condition that enables the initial quantum dot and the ligand compound to react.

In the present disclosure, there is no particular limitation on how to prepare the ligand compound. An alternative way for preparing the ligand compound is described below with reference to FIG. 6:

step S111, reacting 3,6-dibromocarbazole with a boric acid compound to obtain an intermediate, wherein the boric acid compound has a structural formula of

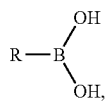

with group R being a coordinating group or a crosslinking group, such that the group R of the boric acid compound replaces the bromine in 3,6-dibromocarbazole, and the intermediate has a structural formula of and

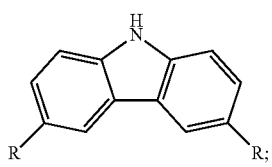

and step S112, reacting the intermediate with a bromo-compound to obtain the ligand compound, wherein the bromo-compound has a structural formula of R1-Br, with group R1 comprising a terminal group of the coordinating group or the crosslinking group, such that the group R1 replaces the hydrogen in the imine group of the intermediate.

The structural formula of 3,6-dibromocarbazole is shown as follows:

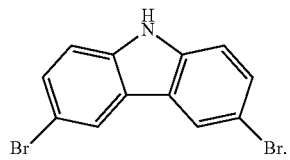 [SMILES: Brc1ccc2[nH]c3ccc(Br)cc3c2c1]

The ligand compound prepared by 3,6-dibromocarbazole may have the coordinating group or the crosslinking group at positions 3 and 6.

The ligand compound obtained in step S112 has a structural formula of:

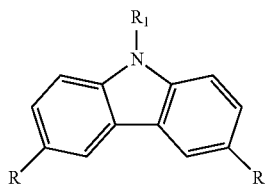

In the present disclosure, the molar ratio of 3,6-dibromocarbazole to the boric acid compound in step S111 is not particularly limited. Theoretically, the molar ratio of 3,6-dibromocarbazole to the boric acid compound is 1:2 to obtain the intermediate, and more boric acid compound may be added to ensure completion of the reaction. In step S111, the following chemical reaction occurs:

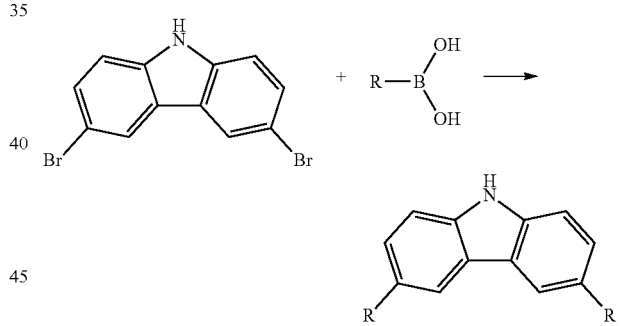

In order to allow the reaction to perform sufficiently, a catalyst may further be added in step S111. The catalyst may be palladium acetate, tri(o-methylphenyl) phosphorus, barium hydroxide monohydrate and the like.

Likewise, in step S112, the molar ratio of the intermediate to the bromo-compound is theoretically 1:1, and more bromo-compound may be added to ensure completion of the reaction.

In step S112, the following chemical reaction occurs:

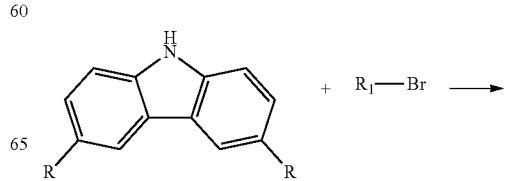

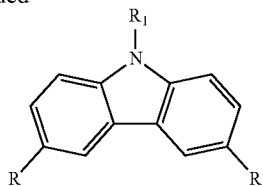

In the manufacturing of the quantum dot material according to the present disclosure, the quantum dot ligand exchange process needs to be performed under the protection of nitrogen, and an anhydrous and oxygen-free ultra-dry solvent is used in the experimental process.

In the present disclosure, there is no particular limitation on how to cure the quantum dot material. For example, the quantum dot material may be cured by thermal curing.

In an alternative embodiment of the present disclosure, a light emitting diode comprising a quantum dot light emitting layer is provided, wherein the quantum dot light emitting layer is made of the quantum dot material according to the present disclosure. Specifically, the quantum dot light emitting layer has a net structure formed by connecting hole transport ligands of the quantum dot material.

As described above, the quantum dot light emitting layer is made of the quantum dot material according to the present disclosure, wherein the quantum dot body in the quantum dot material is capable of emitting light of a predetermined color under excitation of the electric field. In the quantum dot material, the hole transport ligand is formed on the quantum dot body. When the light emitting diode emits light, the hole transport ligand is more favorable for transporting holes to the quantum dot light emitting layer, making the injection of carriers more balanced, and locating the recombination zone in the quantum dot light emitting layer, thereby improving the light emitting efficiency of the light emitting diode.

In an alternative embodiment, as shown in FIG. 3, the hole transport ligands of a plurality of quantum dots of the quantum dot material may be crosslinked with each other. Therefore, in the quantum light emitting layer, the hole transport ligands of the plurality of quantum dots are crosslinked with one another. In FIG. 3, m refers to the number of crosslinked hole transport ligands. In the present disclosure, m is not particularly limited, the numerical value of m has an influence on physical parameters, such as flexibility, of the quantum dot light emitting layer. The numerical range of m may be determined by requirements on the quantum dot light emitting layer, and the corresponding range may be realized by controlling the conditions of the crosslinking reaction. In the present disclosure, m is at least greater than 1.

In another alternative embodiment, as shown in FIG. 4, the hole transport ligand of at least one quantum dot of the quantum dot material has a plurality of coordinating groups. In the quantum dot comprising a plurality of coordinating groups, one of the coordinating groups is bonded to the quantum dot body of this quantum dot, and other coordinating groups are bonded to quantum dot bodies of other quantum dots. Finally, a net structure may also be formed.

In the present disclosure, the specific structure of the light emitting diode is not particularly limited. In an alternative embodiment, the light emitting diode further comprises a first electrode, an electron transport layer and a second electrode, wherein the first electrode, the quantum dot light emitting layer, the electron transport layer and the second electrode are sequentially stacked.

Figure 6:
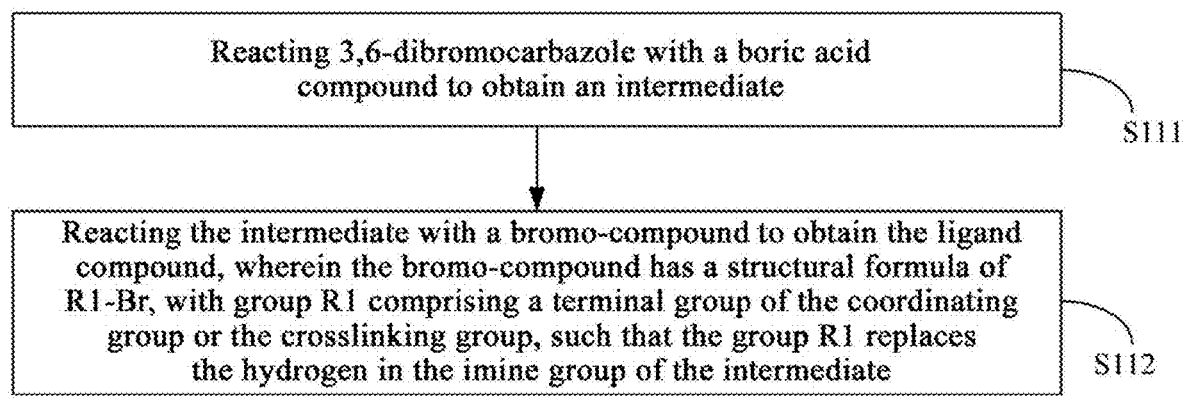
FIG. 6 is a flow chart of the process for manufacturing the hole transport ligand according to one embodiment of the present disclosure.

In order to improve the hole transport performance, a hole injection layer may be disposed between the first electrode and the quantum dot light emitting layer. Specifically, as shown in FIG. 6, one surface of the first electrode is in contact with one surface of the hole injection layer; one surface of the quantum dot light emitting layer is in contact with the other surface of the hole injection layer; one surface of the electron transport layer is in contact with the other surface of the quantum dot light emitting layer; and the other surface of the electron transport layer is in contact with one surface of the second electrode.

Since the quantum dot material of quantum dot light emitting layer comprises hole transport ligand, which can guide holes to the quantum dot light emitting layer, the application of such quantum dot light emitting layers can achieve the functions of both hole transport layer and quantum dot light emitting layer. The light emitting diode according to the present disclosure does not comprise a hole transport layer compared to that in the prior art, thereby providing a simpler structure and reducing the manufacturing cost. In addition, the light emitting diode without the hole transport layer may reduce the hole transport distance when the light emitting diode emits light, thereby reducing the resistance of the light emitting diode and reducing the lighting voltage of the light emitting diode.

The present disclosure is not limited thereto. Alternatively, a hole transport layer may be provided between the quantum dot light emitting layer and the hole injection layer of the light emitting diode.

As described above, the quantum dot material forming the quantum dot light emitting layer may comprise the vinyl. Therefore, after the quantum dot light emitting layer is obtained by crosslinking and curing the quantum dot material, the quantum dot light emitting layer has compact structure and stable performance. After such quantum dot light emitting layer is prepared, the solution of the preparation process will not corrode the quantum dot light emitting layer during the solution process for preparing other film layers, thereby improving yield of the prepared light emitting diode, and prolonging the service life of the light emitting diode.

Figure 7:
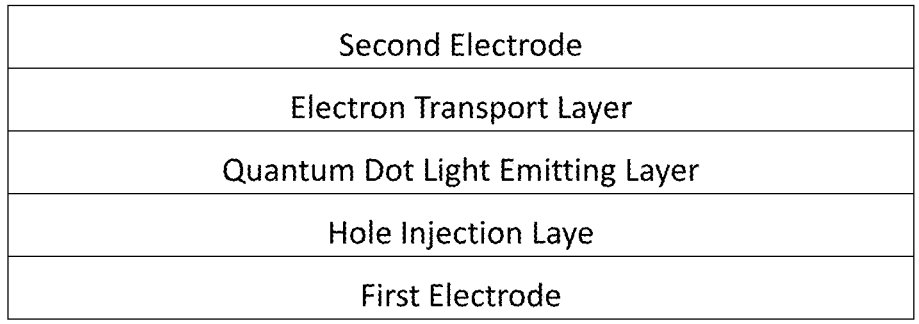
FIG. 7 is a schematic structural diagram of the light emitting diode according to one embodiment of the present disclosure.

In the present disclosure, there is no particular limitation on how to prepare the light emitting diode. In an alternative embodiment, the light emitting diode shown in FIG. 7 may be prepared by the method shown in FIG. 8. Specifically, the method for manufacturing the light emitting diode may comprise steps of:

step S210, providing a substrate comprising a first electrode;

step S220, forming a hole injection layer;

step S230, coating and curing the quantum dot material to obtain a quantum dot light emitting layer, wherein the coating process may be printing or spin coating;

step S240, forming an electron transport layer; and step S250, forming a second electrode.

As can be seen from the above preparation method, after forming the quantum dot light emitting layer, a solution process is still required in step S240. The solution in step S240 could not corrode the quantum dot light emitting layer obtained in step S230.

In an alternative embodiment of the present disclosure, a display panel comprising a light emitting diode is provided, wherein the light emitting diode is the light emitting diode according to the present disclosure.

The light emitting diode provides a high light emitting efficiency, such that the display panel also has high brightness and the power consumption of the display panel is reduced. In addition, the light emitting diode according to the present disclosure has a longer service life, and thus, the service life of the display panel is also improved.

EXAMPLES

Example 1. Preparation of Ligand Compound (e)

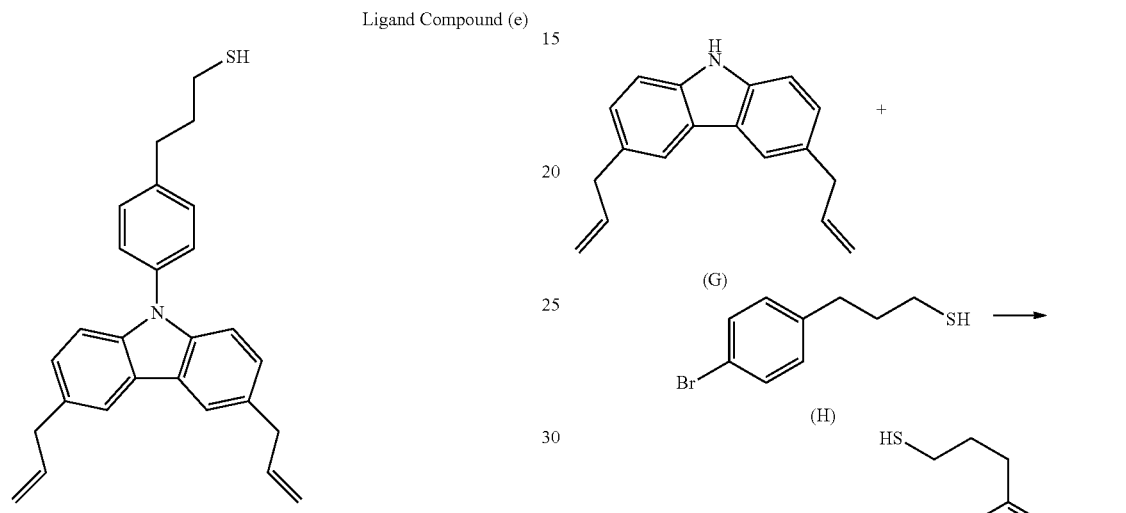

First, intermediate (G) was prepared according to the following reaction formula:

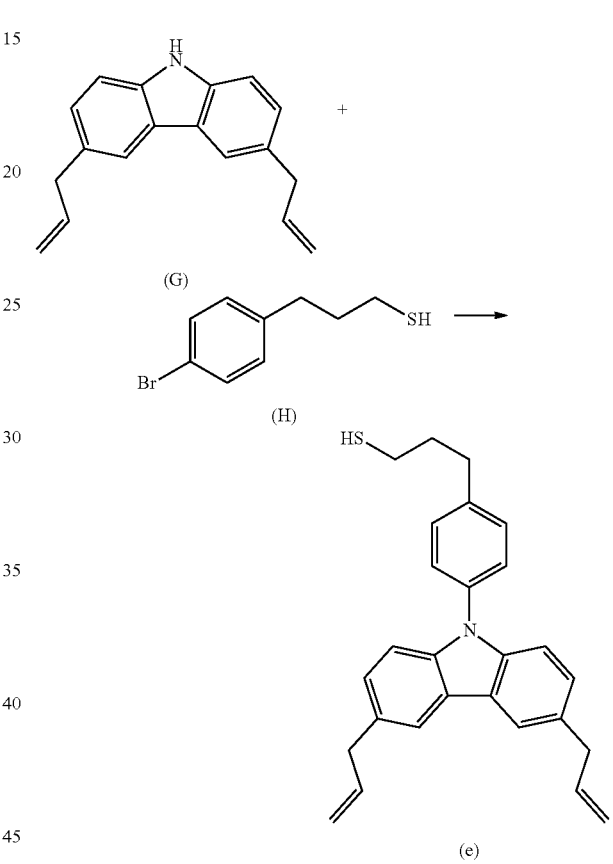

Boric acid compound (F) (2.93 g, 9 mmol), palladium acetate (0.07 g, 0.3 mmol), tris(o-methylphenyl) phosphorus (0.18 g, 0.6 mmol), barium hydroxide monohydrate (3 g, 9 mmol), and 3,6-dibromocarbazole (0.98 g, 3 mmol) were sequentially added to a round-bottomed flask equipped with magnetic stirring under an argon protective atmosphere. Anhydrous ethylene glycol dimethyl ether (24 mL) and ultrapure water (5 mL) were then added with stirring. The resulting green suspension was heated to 80° C. with stirring for 8 hours. After cooling to room temperature, the green suspension was filtered with celite to obtain a yellow filtrate. The yellow filtrate was concentrated in vacuo. The residue was extracted twice with dichloromethane (30 mL), and the organic phases were combined. The organic phase was dried by adding anhydrous sodium sulfate. Anhydrous sodium sulfate was removed by filtration, and the solvent was removed by rotary evaporation to give a crude product. The crude product was purified by silica gel column chromatography, with the eluent of n-hexane:ethyl acetate (10:1). The product was further purified by recrystallization to obtain intermediate (G) (0.64 g, yield 86%).

Then, the ligand compound (e) was prepared according to the following reaction formula:

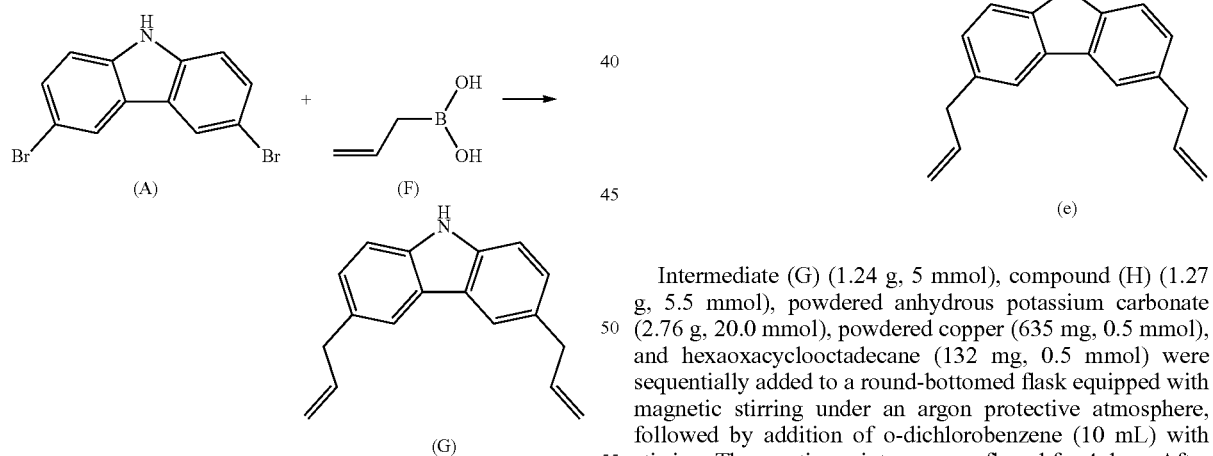

Intermediate (G) (1.24 g, 5 mmol), compound (H) (1.27 g, 5.5 mmol), powdered anhydrous potassium carbonate (2.76 g, 20.0 mmol), powdered copper (635 mg, 0.5 mmol), and hexaoxacyclooctadecane (132 mg, 0.5 mmol) were sequentially added to a round-bottomed flask equipped with magnetic stirring under an argon protective atmosphere, followed by addition of o-dichlorobenzene (10 mL) with stirring. The reaction mixture was refluxed for 4 days. After cooling to room temperature, the copper powder and the inorganic salt were removed by filtration. The solvent was removed by rotary evaporation to give a crude product. The crude product was purified by silica gel column chromatography, with the eluent of n-hexane:ethyl acetate (2:1). The product was further purified by recrystallization to obtain ligand compound (e) (1.26 g, yield 64%).

Example 2. Preparation of Quantum Dot Material

Under a nitrogen protective atmosphere, an initial quantum dot solution (5 mL) was placed in a round-bottomed flask. The solvent in the initial quantum dot solution was removed by rotary evaporation. Then chloroform (5 mL) was added, and the solution was added to a 20 mL reflux flask equipped with magnetic stirring. The temperature was raised to 65° C. The newly synthesized ligand compound (e) in chloroform (0.2 g/mL, 3 mL) was slowly added dropwise to the quantum dot solution in 3 batches with an interval of 1 h. The solution was finally refluxed for 1 h, and cooled to room temperature. A proper amount of acetone was added to the reaction system to settle the quantum dots, and centrifuging to obtain a precipitate. The precipitate was dissolved in toluene (5 mL), and then treated with acetone/toluene cycle 3 times to remove residual oleic acid and uncoordinated ligand compounds on the surface of the quantum dot, to obtain the quantum dot material comprising the hole transport ligand.

Example 3. Preparation of Light Emitting Diodes

Figure 8:
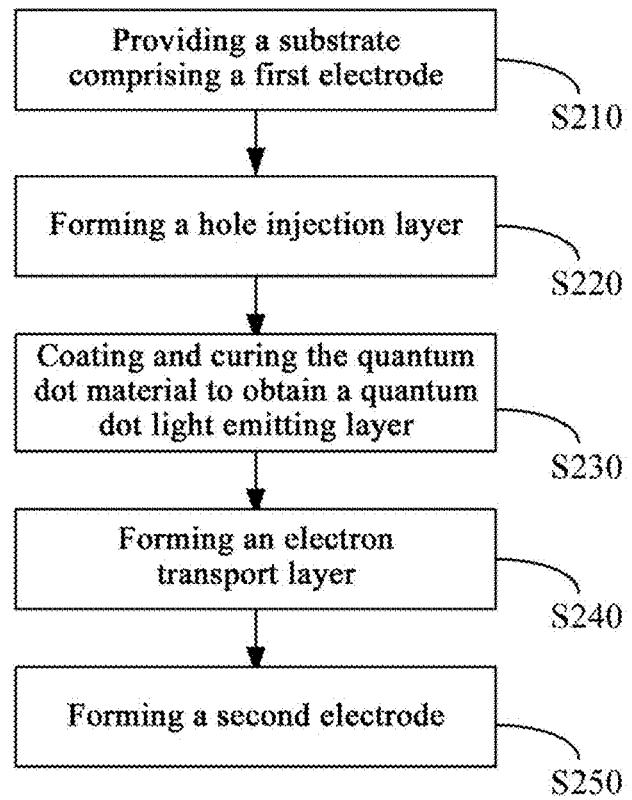
FIG. 8 is a flow chart of the method for manufacturing the light emitting diode according to one embodiment of the present disclosure.

A light emitting diode was manufactured according to the procedure shown in FIG. 8.

In step S210, an ITO glass substrate was ultrasonically cleaned with absolute ethanol and deionized water for 15 min, respectively, then the ITO glass substrate was dried, and then the ITO glass substrate was irradiated with an ultraviolet lamp for 10 min to improve the surface work function of the ITO glass substrate, wherein the ITO glass substrate was used as a first electrode of the light emitting diode (here the first electrode is a cathode).

After the above treatment, in step S220, the ITO glass substrate was spin-coated and deposited with a hole injection layer PEDOT:PSS, and the surface morphology of the hole injection layer was improved by heating and annealing.

In step S230, the quantum dot material of Example 2 was deposited by a solution method, such as printing or spin coating, and then a film is formed by thermal curing to obtain a quantum dot light emitting layer.

In step S240, an electron transport material ZnO was deposited by a solution method to obtain an electron transport layer.

In step S250, an Al electrode serving as a second electrode (here the second electrode is an anode) was vacuum-evaporated.

Figure 9:
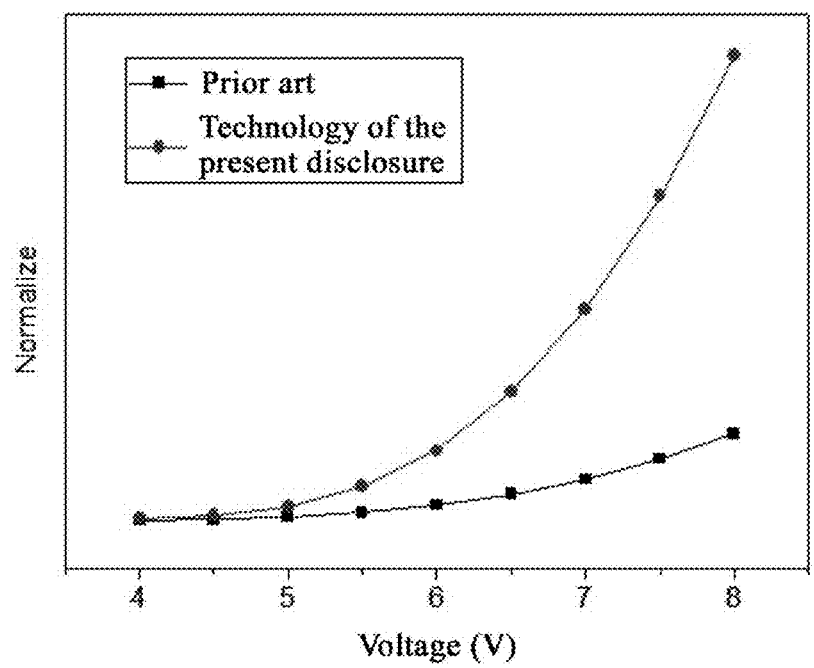
FIG. 9 is a diagram showing the voltage-brightness relationship of the light emitting diode of the present disclosure and that of the prior art.

Property tests were performed with the prepared light emitting diode and the prior art light emitting diode for comparing the results. From the voltage-brightness diagram (see FIG. 9), it can be seen that under the same voltage, the brightness of the quantum dot light emitting diode according to the present disclosure is significantly greater than that of the quantum dot light emitting diode prepared by using the prior art shown in FIG. 1, and the brightness of the present quantum dot light emitting diode at 8V is 4 times higher than that of the quantum dot light emitting diode of the prior art.

Figure 10:
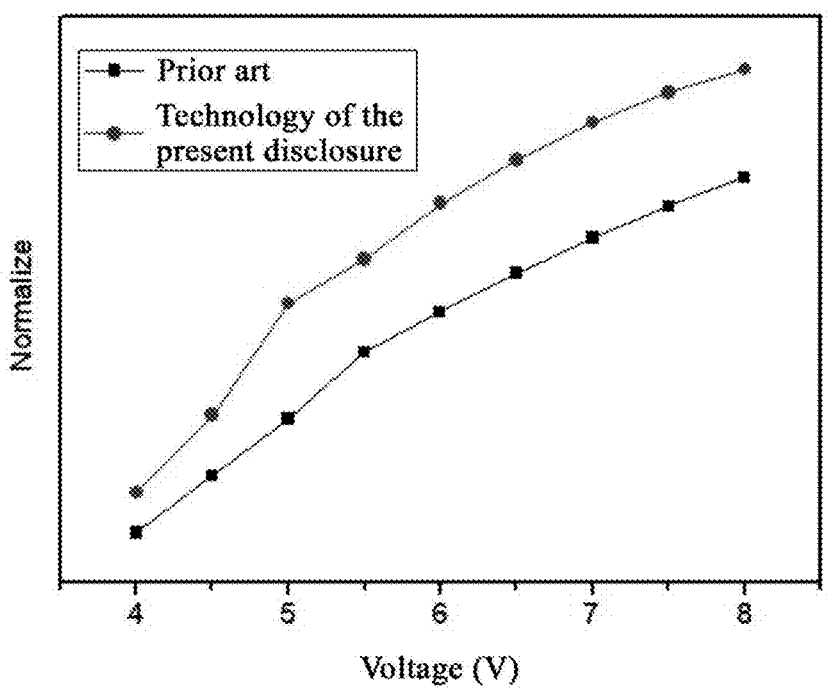
FIG. 10 is a diagram showing the voltage-current efficiency relationship of the light emitting diode of the present disclosure and that of the prior art.

From the voltage-current efficiency diagram (see FIG. 10), it can be seen that under the same voltage, the current efficiency of the quantum dot light emitting diode according to the present disclosure is significantly higher than that of the quantum dot light emitting diode prepared using the prior art shown in FIG. 1, and the current efficiency of the present quantum dot light emitting diode at 8V is increased by 20%.

The above data shows that the technology of the present disclosure can greatly increase the transport rate of holes in the device, make the injection of carriers in the device more balanced, and effectively improve the efficiency of the device.

It can be understood that the foregoing embodiments are merely illustrative embodiments employed for describing the principle of the present disclosure. However, the present disclosure is not limited thereto. For a skilled person in the art, various variations and modifications can be made without departing from the spirit and essence of the present disclosure. These variations and modifications are regarded as the protection scope of the present disclosure.

The invention claimed is:

1. A quantum dot material comprising a quantum dot body and a hole transport ligand bonded to the quantum dot body through a coordinate bond, wherein the hole transport ligand comprises a carbazolyl group, at least one coordinating group and at least one crosslinking group having an unsaturated bond; both of the coordinating group and the crosslinking group are terminal groups of the hole transport ligand; and the coordinating group provides the coordinate bond, wherein a total number of the coordinating groups and crosslinking groups of the hole transport ligand is not less than 3;

the hole transport ligand has a structural formula of:

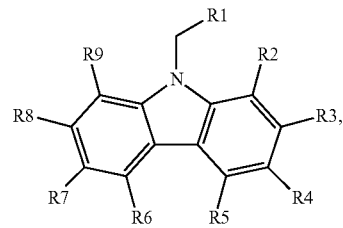

wherein one or two of R1, R4 and R7 each have a terminal group of the coordinating group and other one or two of R1, R4 and R7 each have a terminal group of the crosslinking group, and R2, R3, R5, R6, R8 and R9 is H;

or R1, R3, R5, R6 and R8 each have the crosslinking group as a terminal group and R2, R4, R7 and R9 each have the coordinating group as a terminal group.

2. The quantum dot material of claim 1, wherein the coordinating group is linked to the carbazolyl group through a first alkyl chain, and the first alkyl chain has a number of carbon atoms of not more than 10.

3. The quantum dot material of claim 1, wherein the crosslinking group is linked to the carbazolyl group through a second alkyl chain, and the second alkyl chain has a number of carbon atoms of not more than 10.

4. The quantum dot material of claim 1, wherein at least one terminal group containing R1 to R9 has a benzene ring group.

5. The quantum dot material of claim 1, wherein the coordinating group of the hole transport ligand is selected from at least one of mercapto, poly-mercapto, carboxyl, amino, polyamino, and phosphinyloxy group.

6. The quantum dot material of claim 1, wherein the hole transport ligand has a structural formula selected from any one of:

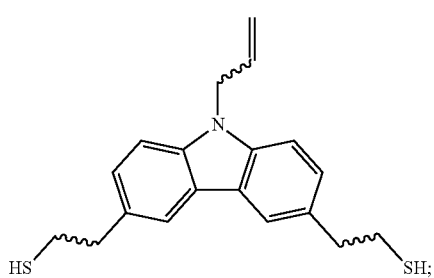

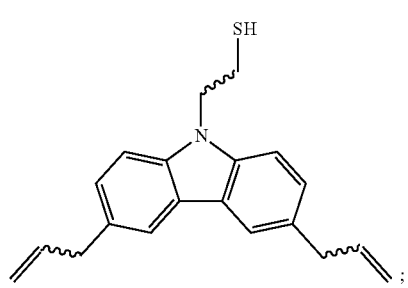

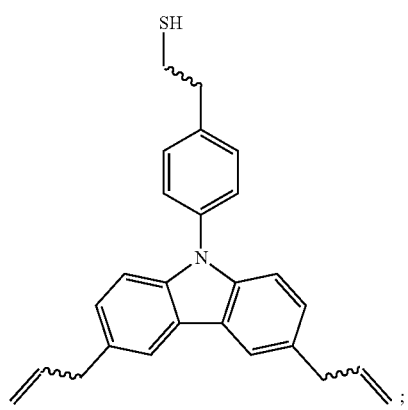

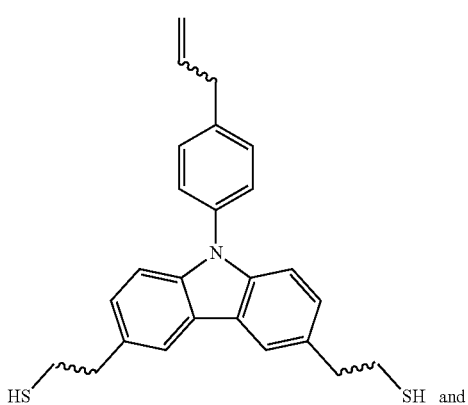

-continued

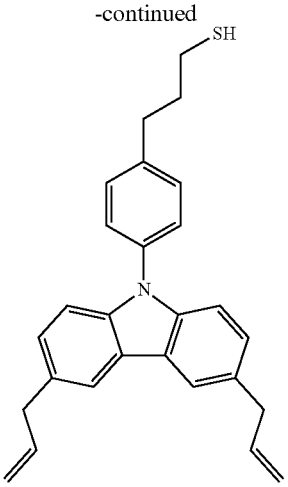

wherein ⁓ is an alkyl chain having a number of carbon atoms of not more than 10.

7. A method for manufacturing a quantum dot material comprising steps of:
providing a solution of a ligand compound, wherein reacting 3,6-dibromocarbazole with a boric acid compound to obtain an intermediate, wherein the boric acid compound has a structural formula of

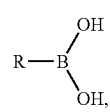

with group R being a coordinating group or a crosslinking group, such that the group R of the boric acid compound replaces the bromine in 3,6-dibromocarbazole, and the intermediate has a structural formula of

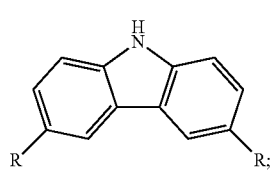

and reacting the intermediate with a bromo-compound to obtain the ligand compound, wherein the bromo-compound has a structural formula of R1-Br, with group R1 comprising the coordinating group or the crosslinking group as a terminal group, such that the group R1 replaces the hydrogen in the imine group of the intermediate, wherein R1 is a coordinating group when R is a crosslinking group, or R1 is a crosslinking group when R is a coordinating group;
providing a solution of an initial quantum dot, wherein the initial quantum dot comprises a quantum dot body; and
mixing the solution of a ligand compound with the solution of an initial quantum dot solution, such that the ligand compound reacts with the quantum dot body, wherein the coordinating group of the ligand compound is bonded to the quantum dot body to provide the quantum dot material.

8. A light emitting diode comprising a quantum dot light emitting layer, wherein the quantum dot light emitting layer has a net structure formed by connecting hole transport ligands of the quantum dot material according to claim 1.

9. The light emitting diode of claim 8, wherein the crosslinking groups of a plurality of the quantum dots are crosslinked with one another in the quantum dot light emitting layer; and/or
    in the quantum dot light emitting layer, at least one quantum dot has the hole transport ligand comprising a plurality of coordinating groups, wherein one of the coordinating groups in the quantum dot is bonded to the quantum dot body of the quantum dot, and other coordinating groups are bonded to quantum dot bodies of other quantum dots.

10. The light emitting diode of claim 8, further comprising a first electrode, an electron transport layer, and a second electrode, wherein the first electrode, the quantum dot light emitting layer, the electron transport layer, and the second electrode are sequentially stacked.

11. A display panel comprising a plurality of light emitting diode according to claim 8.

\* \* \* \* \*